(12) United States Patent
Chen

(10) Patent No.: US 10,141,475 B1
(45) Date of Patent: Nov. 27, 2018

(54) METHOD FOR BINDING MICRO DEVICE TO CONDUCTIVE PAD

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 15/853,839

(22) Filed: Dec. 24, 2017

(51) Int. Cl.
| | |
|---|---|
| *H01L 33/62* | (2010.01) |
| *H01L 33/00* | (2010.01) |
| *H01L 33/36* | (2010.01) |
| *H01S 5/02* | (2006.01) |
| *H01L 23/00* | (2006.01) |
| *H01S 5/183* | (2006.01) |

(52) U.S. Cl.
CPC ............ *H01L 33/005* (2013.01); *H01L 24/03* (2013.01); *H01L 24/04* (2013.01); *H01L 24/05* (2013.01); *H01L 24/06* (2013.01); *H01L 33/36* (2013.01); *H01L 33/62* (2013.01); *H01S 5/0216* (2013.01); *H01S 5/183* (2013.01)

(58) Field of Classification Search
CPC ......... H01L 33/62; H01L 24/03; H01L 24/04; H01L 24/05; H01L 24/06; H01L 33/36; H01S 5/0216
See application file for complete search history.

(56) References Cited

U.S. PATENT DOCUMENTS

| | | | | |
|---|---|---|---|---|
| 2005/0194605 A1* | 9/2005 | Shelton | ................... | H01L 33/62 257/99 |
| 2005/0258438 A1* | 11/2005 | Arik | ......................... | F21K 9/00 257/88 |
| 2012/0153317 A1* | 6/2012 | Emerson | ........... | G02F 1/133603 257/89 |
| 2015/0179605 A1* | 6/2015 | Dubey | ................... | H01L 24/80 257/777 |

OTHER PUBLICATIONS

Suzana Uran et al., "Reliable and Accurate Release of Micro-Sized Objects with a Gripper that Uses the Capillary-Force Method", Micromachines 2017, 8 , 182; doi:10.3390/mi8060182.
Defeng Lang, "A Study on Micro-gripping Technologies", ISBN / EAN: 978-90-9023424-3, Oct. 15, 2008.

* cited by examiner

*Primary Examiner* — Fei Fei Yeung Lopez
(74) *Attorney, Agent, or Firm* — CKC & Partners Co., Ltd.

(57) ABSTRACT

A method for binding a micro device to a conductive pad of an array substrate is provided. The method includes: forming a liquid layer on the conductive pad of the array substrate; disposing the micro device over the conductive pad such that the micro device is in contact with the liquid layer and is gripped by a capillary force produced by the liquid layer between the micro device and the conductive pad, wherein the micro device comprises an electrode facing the conductive pad; and evaporating the liquid layer such that the electrode is bound to and is in electrical contact with the conductive pad.

16 Claims, 7 Drawing Sheets

METHOD FOR BINDING MICRO DEVICE TO CONDUCTIVE PAD

BACKGROUND

Field of Invention

The present disclosure relates to a method for binding a micro device to at least one conductive pad.

Description of Related Art

In the recent years, light-emitting diodes (LEDs) have become popular in general and commercial lighting applications. As light sources, LEDs have many advantages including low energy consumption, long lifetime, small size, and fast switching, and hence conventional lighting, such as incandescent lighting, is gradually replaced by LED lights.

SUMMARY

According to some embodiments of the present disclosure, a method for binding a micro device to a conductive pad of an array substrate is provided. The method includes: forming a liquid layer on the conductive pad of the array substrate; disposing the micro device over the conductive pad such that the micro device is in contact with the liquid layer and is gripped by a capillary force produced by the liquid layer between the micro device and the conductive pad, wherein the micro device comprises an electrode facing the conductive pad; and evaporating the liquid layer such that the electrode is bound to and is in electrical contact with the conductive pad.

According to some embodiments of the present disclosure, a structure formed by the method for binding a micro device to a conductive pad of an array substrate is provided. The structure includes an array substrate including the conductive pad; and a micro device including the electrode bound to and in electrical contact with the conductive pad.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
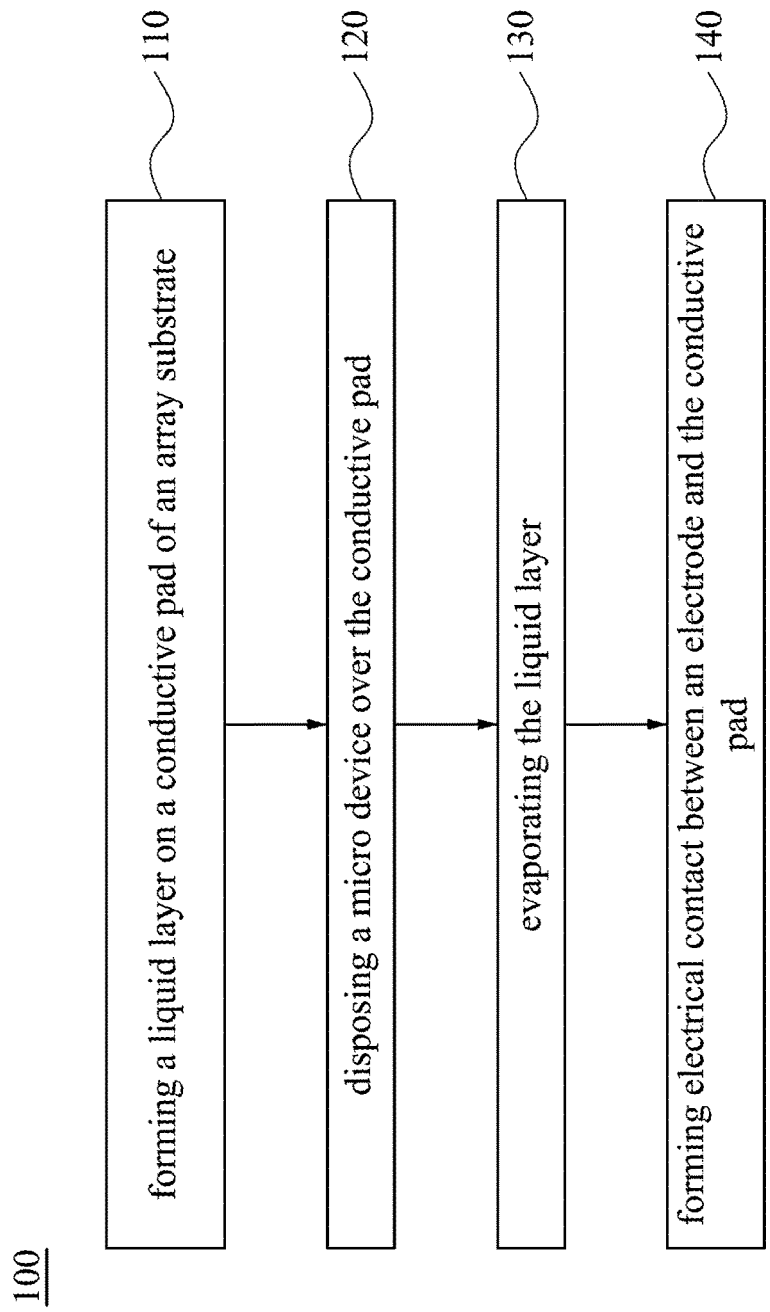
FIG. 1 is a flow chart of a method for binding a micro device to a conductive pad of an array substrate according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "in an embodiment" or the like in various places throughout this specification are not necessarily referring to the same embodiment of the invention. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 2:
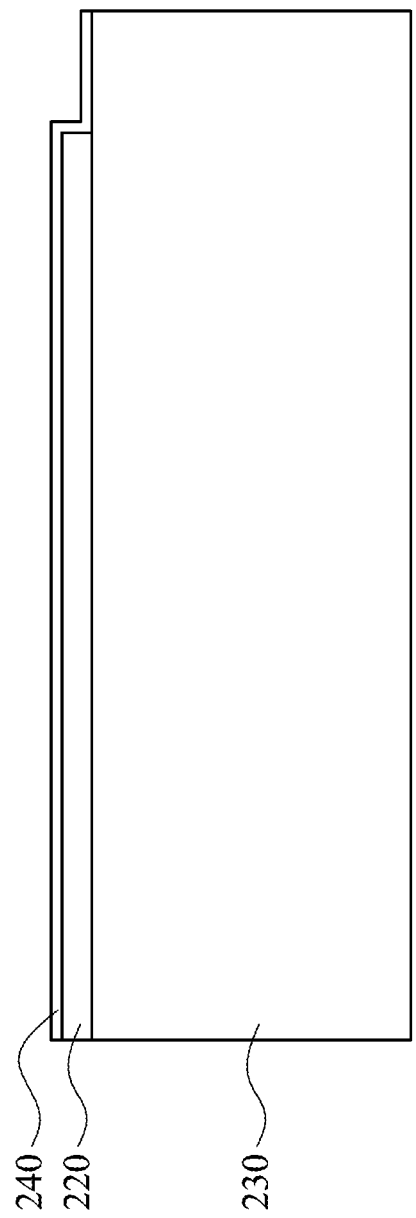
FIG. 2 is a schematic cross-sectional view of an intermediate step of forming a liquid layer on the conductive pad of the array substrate according to one embodiment of the present disclosure.
Figure 3:
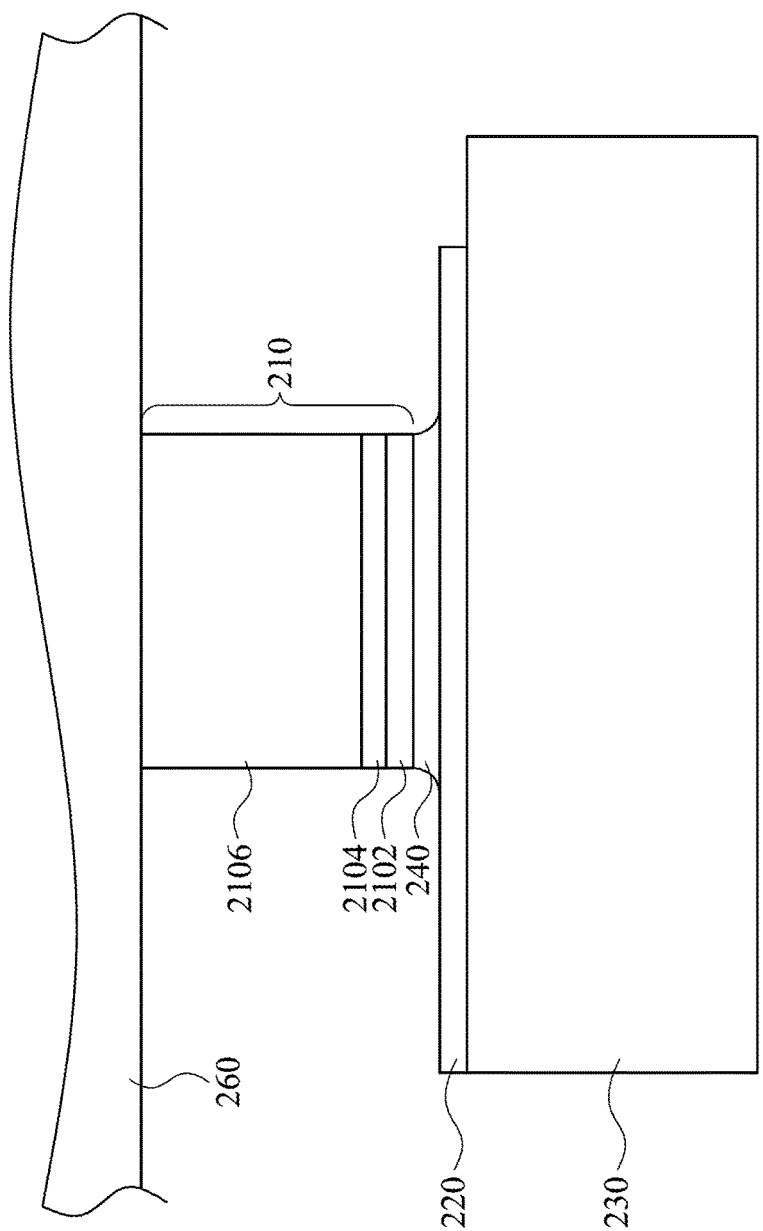
FIG. 3 is a schematic cross-sectional view of an intermediate step of disposing the micro device over the conductive pad according to one embodiment of the present disclosure.
Figure 4:
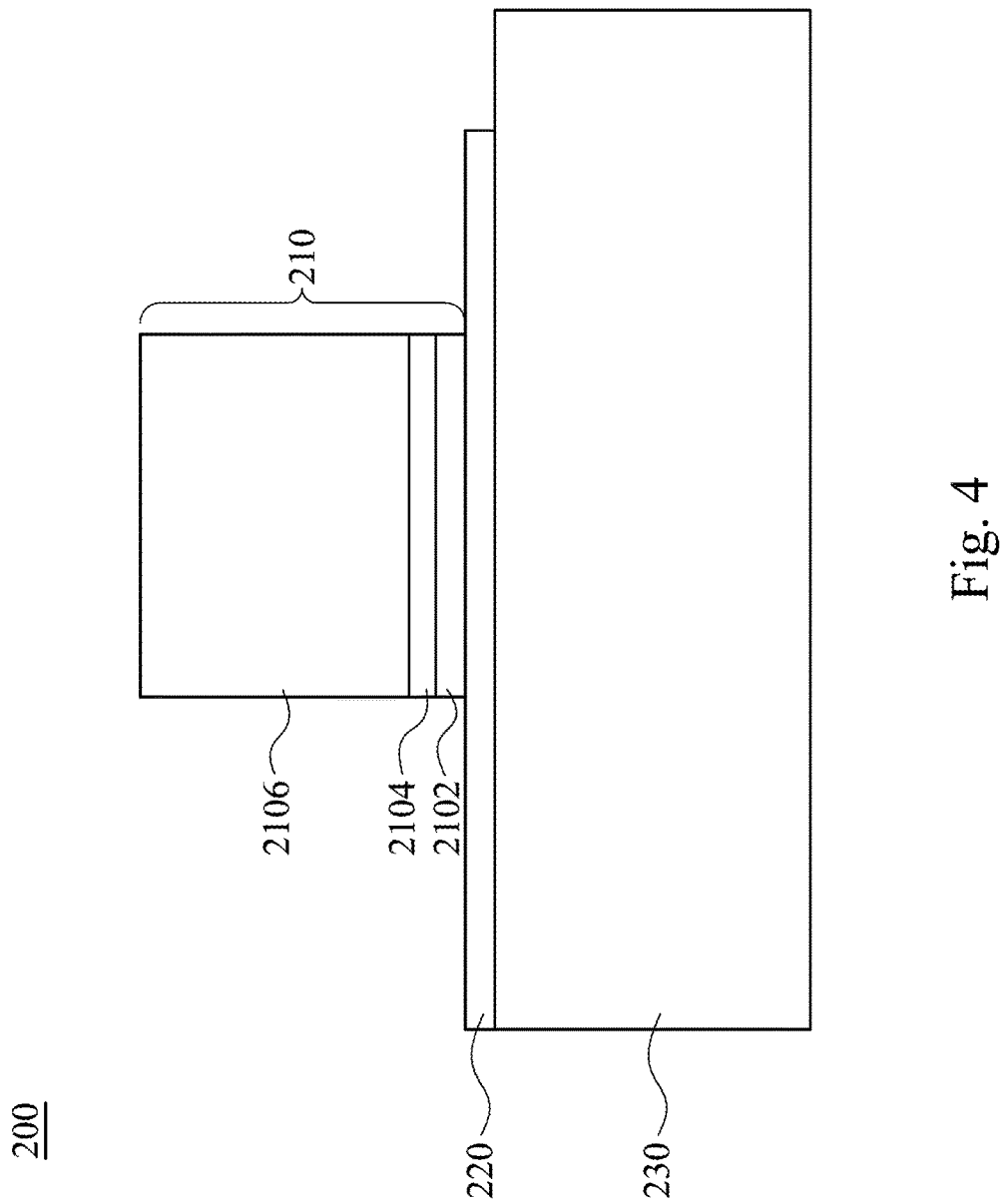
FIG. 4 is a schematic cross-sectional view of a structure after evaporating the liquid layer according to one embodiment of the present disclosure.

FIG. 1 is a flow chart of a method for binding a micro device to a conductive pad of an array substrate according to some embodiments of the present disclosure. FIGS. 2 to 4 are schematic cross-sectional views of intermediate steps of the method of FIG. 1. Reference is made to FIGS. 1 to 4. The method begins with operation 110 in which a liquid layer 240 is formed on the conductive pad 220 of the array substrate 230 (FIG. 2). The method continues with operation 120 in which the micro device 210 is disposed over the conductive pad 220, such that the micro device 210 is in contact with the liquid layer 240 and is gripped by a capillary force produced by the liquid layer 240 between the micro device 210 and the conductive pad 220, wherein the micro device 210 includes an electrode 2102 facing the conductive pad 220 (FIG. 3). The method continues with operations 130 and 140 in which the liquid layer 240 is evaporated, such that the electrode 2102 is bound to and is in electrical contact with the conductive pad 220 (FIG. 4).

Reference is made to FIG. 2. A liquid layer 240 is formed on a conductive pad 220 of an array substrate 230. The formation of the liquid layer 240 may be achieved by lowering a temperature of the conductive pad 220 in an environment including a vapor, such that at least a portion of the vapor is condensed to form the liquid layer 240 on the conductive pad 220. In some embodiments, the temperature of the conductive pad 220 is lowered to about the water dew point, such that the water vapor in the environment is condensed to form liquid water, i.e., the liquid layer 240. In these embodiments, the liquid layer 240 includes water. In alternative embodiments, the liquid layer 240 may include methyl alcohol, ethanol, glycerol, combinations thereof, or the like. Furthermore, the formation of the liquid layer 240 may also be achieved by inkjet printing, roller coating, dip coating, or the like.

Reference is made to FIG. 3. The micro device 210 is disposed over the conductive pad 220, such that the micro device 210 is in contact with the liquid layer 240. The meniscus of the liquid layer 240 is caused by a capillary force. The micro device 210 is gripped by the capillary force produced by the liquid layer 240 between the micro device 210 and the conductive pad 220. In some embodiments, a thickness of the liquid layer 240 is less than a thickness of the micro device 210 when the micro device 210 is gripped by the capillary force. In some embodiments, the micro device 210 is picked up from a carrier substrate and then placed over the conductive pad 220 by a transfer head array 260. The transfer head array 260 may exert a picking-up pressure on the micro device 210 by, for example, vacuum, adhesion, magnetic, electrostatic attraction, or the like. In some embodiments, the micro device 210 may be a micro light emitting diode (LED). The micro LED 210 mainly includes an electrode 2102 facing the conductive pad 220, a first type semiconductor layer 2104, and a second type semiconductor layer 2106. The first type semiconductor layer 2104 is between the second type semiconductor layer 2106 and the electrode 2102. The micro LED 210 may further include an active layer between the first type semiconductor layer 2104 and the second type semiconductor layer 2106.

Reference is made to FIG. 4. The liquid layer 240 is evaporated, such that the electrode 2102 is bound to and is in electrical contact with the conductive pad 220. The evaporation of the liquid layer 240 may be achieved by, for example, raising a temperature of the conductive pad 220. After the liquid layer 240 is evaporated, the electrode 2102 is stuck to the conductive pad 220. The resulting structure includes the array substrate 230 and the micro device 210. The electrode 2102 of the micro device 210 is bound to and in electrical contact with the conductive pad 220.

Figure 5:
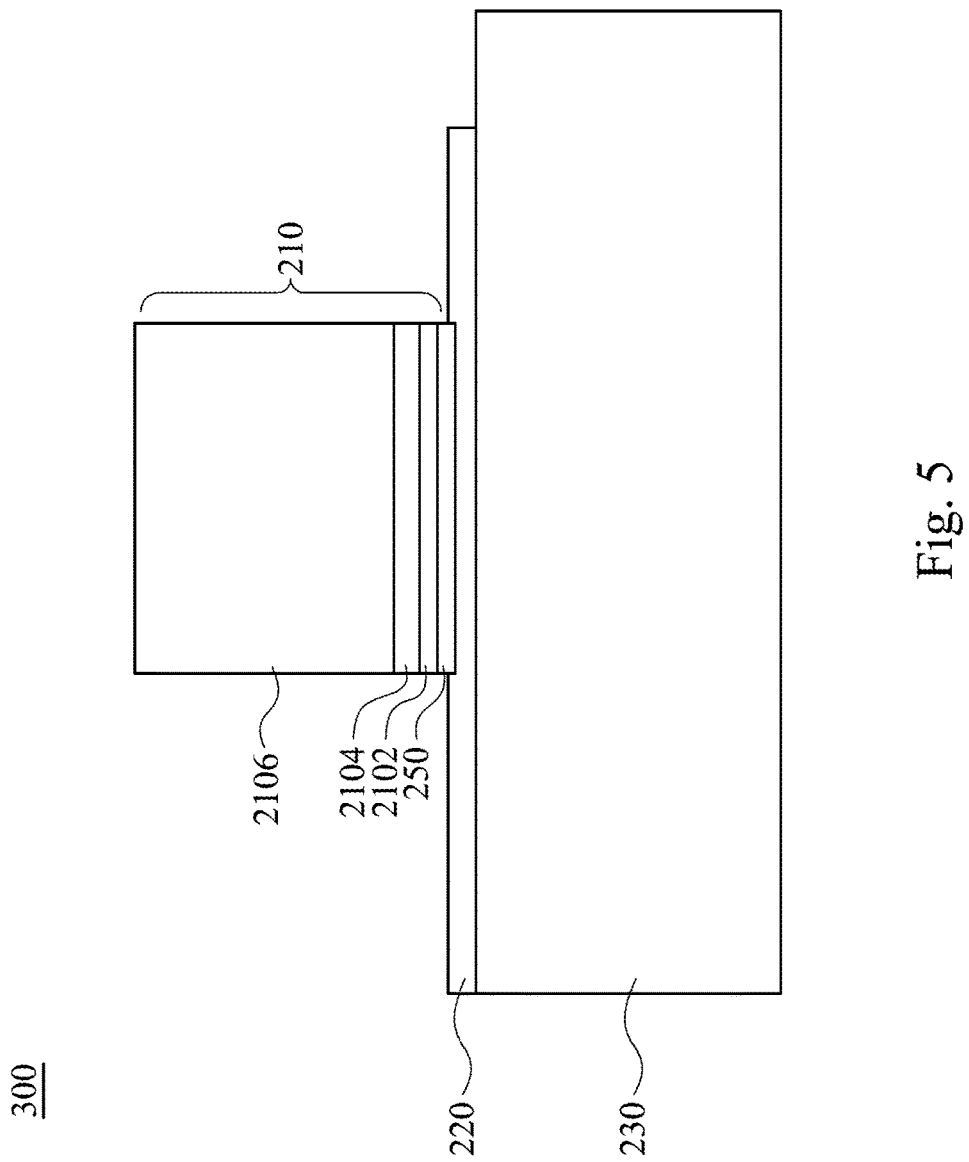
FIG. 5 is a schematic cross-sectional view of an intermediate step of a structure after raising a temperature of the conductive pad according to one embodiment of the present disclosure.

Reference is made to FIG. 5. After the electrode 2102 is stuck to the conductive pad 220, the electrode 2102 is bonded to the conductive pad 220. In some embodiments, at least one of the conductive pad 220 and the electrode 2102 includes a bonding material, such as solder. A temperature of the conductive pad 220 is raised to be above a melting point of the bonding material to facilitate bonding, followed by cooling to solidify the bond. FIG. 5 shows the resulting structure in which the electrode 2102 is bonded to the conductive pad 220. There is an alloy 250 between the conductive pad 220 and the electrode 2102. The alloy 250 includes the bonding material.

In the above embodiments supported by FIGS. 1 to 5, after the micro device 210 is over the conductive pad 220, the micro device 210 is gripped by the capillary force produced by the liquid layer 240 between the micro device 210 and the conductive pad 220. After the liquid layer 240 is evaporated, the micro device 210 is stuck to the conductive pad 220. As such, the micro device 210 can be kept in place before and during the bonding to facilitate the bonding.

In alternative embodiments, the bond between the electrode 2102 and the conductive pad 220 may be achieved by eutectic alloy bonding. In these embodiments, the temperature of the conductive pad 220 may be raised to be above a eutectic point of the conductive pad 220 and the electrode 2102 to achieve eutectic alloy bonding.

The scenario illustrated in FIGS. 2 to 5 can be adopted to many kinds of micro devices 210. In some embodiments, the micro device 210 is a vertical type light emitting diode or a vertical-cavity surface-emitting laser (VCSEL). The term "vertical" herein means the electrode electrically connected to the first type semiconductor layer and the electrode electrically connected to the second type semiconductor layer are placed on opposite sides of the micro device.

In addition to the embodiments as illustrated in FIGS. 2 to 5, in some embodiments, a plurality of the conductive pads are arranged on the array substrate, spaced apart from each other, and electrically independent from each other. In these embodiments, the micro device includes a plurality of the electrodes respectively bind to and in electrical contact with the conductive pads.

Figure 6:
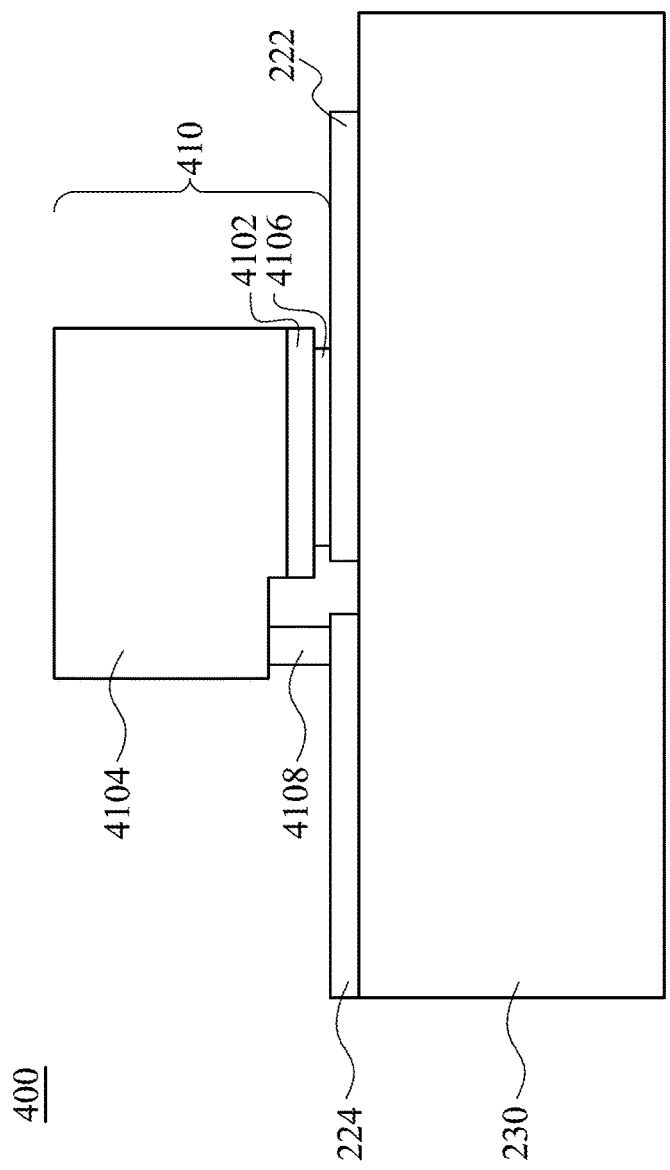
FIG. 6 is a schematic cross-sectional view of a flip chip type light emitting diode according to one embodiment of the present disclosure.

Reference is made to FIG. 6. In some embodiments, the micro device 410 is a flip chip type light emitting diode (LED). The flip chip type LED 410 includes a first type semiconductor layer 4102, a second type semiconductor layer 4104, a first electrode 4106, and a second electrode 4108. The second type semiconductor layer 4104 is joined with the first type semiconductor layer 4102. The first electrode 4106 is electrically connected to the first type semiconductor layer 4102. The second electrode 4108 is electrically connected to the second type semiconductor layer 4104. The array substrate 230 has at least two individual conductive pads 222, 224. The conductive pads 222, 224 are spaced apart from each other and are electrically independent from each other. In some embodiments, the first type semiconductor layer 4102 is a p type semiconductor layer, the second type semiconductor layer 4104 is an n type semiconductor layer, the conductive pad 222 is configured to receive the positive supply voltage, and the conductive pad 224 is configured to receive the ground voltage or the negative supply voltage. The flip chip type LED 410 may further include an active layer between the first type semiconductor layer 4102 and the second type semiconductor layer 4104. By performing a method similar to the method 100 shown in FIGS. 1-4, the first electrode 4106 and the second electrode 4108 can be respectively stuck to the conductive pads 222, 224. Then, the first electrode 4106 and the second electrode 4108 can be respectively bonded to the conductive pads 222, 224 by, for example, solder bonding, eutectic alloy bonding, or the like. In some embodiments, the electrodes 4106, 4108 of the micro device 410 are substantially coplanar.

Figure 7:
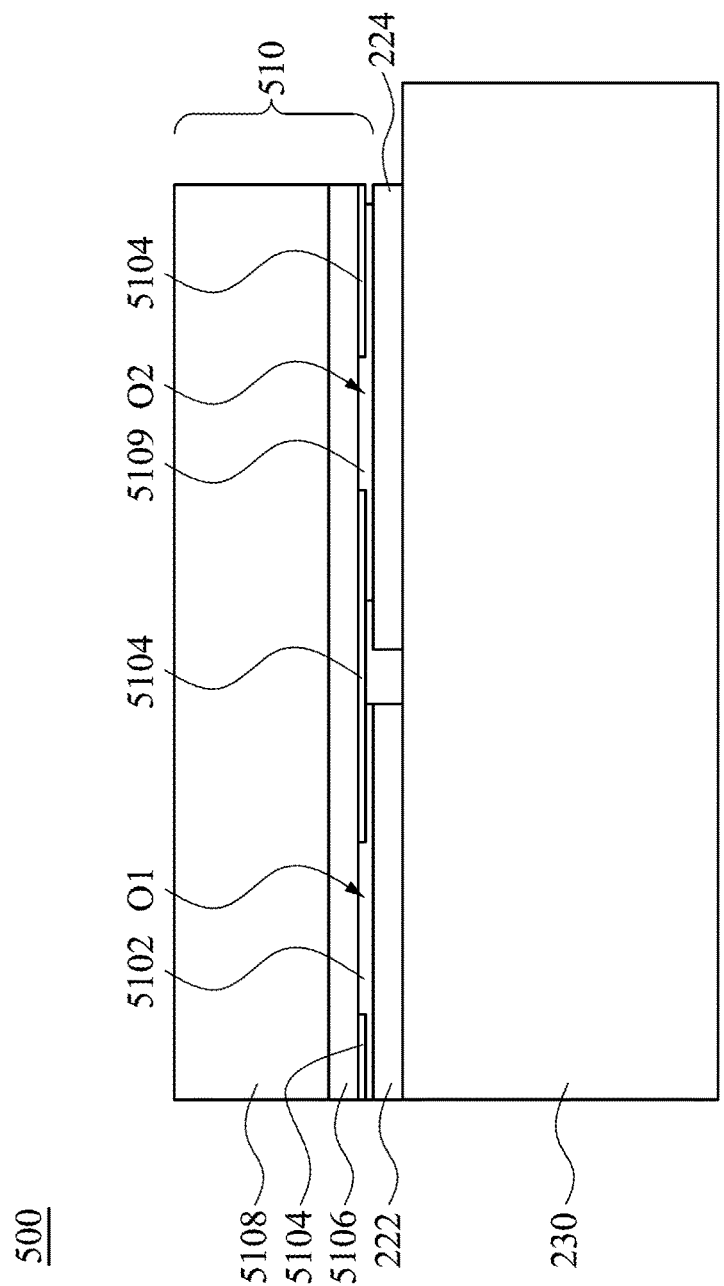
FIG. 7 is a schematic cross-sectional view of a vertical type light emitting diode according to one embodiment of the present disclosure.

Reference is made to FIG. 7. In some embodiments, the micro device 510 is a vertical type light emitting diode (LED). The vertical type LED 510 includes a first type semiconductor layer 5106, a second type semiconductor layer 5108, a current control layer 5104, a first electrode 5102, and a second electrode 5109. The second type semiconductor layer 5108 is joined with the first type semiconductor layer 5106. The current control layer 5104 is joined with the first type semiconductor layer 5106. The current control layer 5104 has a first opening O1 and a second opening O2 therein. The first electrode 5102 is electrically connected to the first type semiconductor layer 5106 through the first opening O1. The second electrode 5109 is electrically connected to the first type semiconductor layer 5106 through the second opening O2. The array substrate 230 has at least two individual conductive pads 222, 224. The conductive pads 222, 224 are spaced apart from each other and are electrically independent from each other. For example, the conductive pad 222 is configured to receive a first voltage, and the conductive pad 224 is configured to receive a second voltage. The first voltage and the second voltage may be the same or different. The vertical type LED 510 may further include an active layer between the first type semiconductor layer 5106 and the second type semiconductor layer 5108. By performing a method similar to the method 100 shown in FIGS. 1-4, the first electrode 5102 and the second electrode 5109 can be respectively stuck to the conductive pads 222, 224. Similarly, the first electrode 5102 and the second electrode 5109 can be then respectively bonded to the conductive pads 222, 224 by, for example, solder bonding, eutectic alloy bonding, or the like. In some other embodiments, the micro device 510 may also be a vertical-cavity surface-emitting laser (VCSEL).

By forming a liquid layer 240 on the conductive pad 220, the micro device 210 disposed over the conductive pad 220 is gripped by a capillary force produced by the liquid layer 240. After evaporating the liquid layer 240, the micro device 210 is stuck to the conductive pad 220. As such, the micro device 210 is kept in place before and during the bonding to facilitate the bonding.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for binding a micro device to a conductive pad of an array substrate, the method comprising:
    lowering a temperature of the conductive pad in an environment comprising a vapor such that at least a portion of the vapor is condensed to form a liquid layer on the conductive pad;
    disposing the micro device over the conductive pad such that the micro device is in contact with the liquid layer and is gripped by a capillary force produced by the liquid layer between the micro device and the conductive pad, wherein the micro device comprises an electrode facing the conductive pad; and
    evaporating the liquid layer such that the electrode is bound to and is in electrical contact with the conductive pad.

2. The method of claim 1, wherein the liquid layer comprises water.

3. The method of claim 1, wherein the liquid layer comprises water.

4. The method of claim 3, wherein the temperature of the conductive pad is lowered to about the water dew point.

5. The method of claim 1, wherein evaporating the liquid layer comprises:
    raising a temperature of the conductive pad such that the electrode is stuck to the conductive pad after the liquid layer is evaporated.

6. The method of claim 1, wherein at least one of the conductive pad and the electrode comprises a bonding material;
    further comprising:
    raising a temperature of the conductive pad to be above a melting point of the bonding material after evaporating the liquid layer.

7. The method of claim 1, further comprising:
    raising a temperature of the conductive pad to be above an eutectic point of the conductive pad and the electrode after evaporating the liquid layer.

8. The method of claim 1, wherein a thickness of the liquid layer is less than a thickness of the micro device when the micro device is gripped by the capillary force.

9. A structure formed by the method of claim 1, the structure comprising:
    the array substrate comprising the conductive pad; and
    the micro device comprising the electrode bound to and in electrical contact with the conductive pad.

10. The structure of claim 9, wherein the micro device is a vertical type light emitting diode.

11. The structure of claim 9, wherein the micro device is a vertical-cavity surface-emitting laser.

12. The structure of claim 9, wherein a plurality of the conductive pads are arranged on the array substrate, are spaced apart from each other, and are electrically independent from each other, and the micro device comprises a plurality of the electrodes respectively bond to and in electrical contact with the conductive pads.

13. The structure of claim 12, wherein the micro device is a flip chip type light emitting diode.

14. The structure of claim 12, wherein the electrodes of the micro device are substantially coplanar.

15. The structure of claim 12, wherein the micro device is a vertical type light emitting diode.

16. The structure of claim 12, wherein the micro device is a vertical-cavity surface-emitting laser.

* * * * *